United States Patent
Ohshima et al.

(10) Patent No.: US 6,867,993 B2
(45) Date of Patent: Mar. 15, 2005

(54) SEMICONDUCTOR MEMORY DEVICE (75) Inventors: Shigeo Ohshima, Yokohama (JP); Nobuo Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/910,603

(22) Filed: Jul. 19, 2001

(65) Prior Publication Data

US 2002/0012263 A1 Jan. 31, 2002

(30) Foreign Application Priority Data

Jul. 21, 2000 (JP) ........................................ 2000-220993

(51) Int. Cl.[7] .............................................. G11C 5/06
(52) U.S. Cl. ............................ 365/63; 365/51; 365/201
(58) Field of Search ............................. 365/63, 51, 52, 365/201; 257/777, 735

(56) References Cited

FOREIGN PATENT DOCUMENTS

| CN | 1227387 | 9/1999 |
|----|---------|--------|
| JP | 03-041758 | 2/1991 |
| JP | 11-242663 | 9/1999 |

OTHER PUBLICATIONS

Watanabe, et al. "A 286mm2 256Mb DRAM with X32 Both-Ends DQ"—Toshiba, IBM, Siemens at IBM Semiconductor Research and Development Center, Hopewell Junction, NY 12533 USA—1995 Symposium on VLSI Circuits Digest of Technical Papers pp. 105–106.

Primary Examiner—Son T. Dinh
(74) Attorney, Agent, or Firm—Hogan & Hartson, LLP (57) ABSTRACT

In the package, a semiconductor chip is accommodated. This semiconductor chip has n pads (n is a natural number). The package has n pins connected to n pads.

16 Claims, 11 Drawing Sheets

201: VXMODE1
202: VXMODE2

| Structure | VXMODE1 | VXMODE2 | b×4 | ×16 | Internal bus | Column address |
|---|---|---|---|---|---|---|
| ×4 | Open | Vss | L | L | 4 bits | 2048 bits |
| ×8 | Vss | Open | H | L | 8 bits | 1024 bits |
| ×16 | Open | Open | H | H | 16 bits | 512 bits |

| Structure | Assembly | Package test |
|---|---|---|
| ×4 | 4 I/O VXMODE2 | ×4 |
| ×8 | 8 I/O VXMODE1 | ×8 |
| ×16 | 16 I/O | ×16 |

FIG. 6B

| Structure | Assembly | Package test |
|---|---|---|
| ×4 | 16 I/O VXMODE2 | ×16 Partially×4 |
| ×8 | 16 I/O VXMODE1 | ×16 Partially×8 |
| ×16 | 16 I/O | ×16 |

SEMICONDUCTOR MEMORY DEVICE

CROSS-REFERENCE TO RELATED APPLICATIONS

This application is based upon and claims the benefit of priority from the prior Japanese Patent Application No. 2000-220993, filed Jul. 21, 2000, the entire contents of which are incorporated herein by reference.

BACKGROUND OF THE INVENTION

The present invention relates to a semiconductor memory device, and more particularly to a semiconductor memory device which is capable of switching over an input and output structure (hereinafter referred to as I/O structure).

BRIEF SUMMARY OF THE INVENTION

According to an aspect of the present invention, there is provided a semiconductor memory device comprising: a semiconductor chip which can set different bit structure, the chip having a plurality of pads; a package accommodating the semiconductor chip and having a plurality of pins, all the pins being connected to the pad in accordance with the maximum bit structure of the semiconductor chip; and a switch-over circuit provided inside of he semiconductor chip for switching over the data bit structure.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

A semiconductor memory device has been developed which is capable of switching over a combination of an I/O structure and a column address structure by wire bonding. In this manner, a combination of the I/O address and a column address structure is switched over by wire bonding, so that the products having a different bit width can be developed efficiently.

In recent years, a capacity of a semiconductor memory, in particular, a dynamic memory (hereinafter, referred to as a DRAM) is increased and a manufacturing process thereof is complicated. In connection with this, time required for the test of the product rapidly increases. Therefore, a test cost of the DRAM is also increased. On the other hand, a request on the reduction of the development period of the product has become extremely strict. In particular, an efficient development of products having the same storage capacity and a different I/O bit width has become an important issue.

Conventionally, in the development of the DRAM product, different chips have been designed, for example, in accordance with the specification of the I/O structure of the memory. However, recently, for the improvement in the development efficiency and the reduction of the development schedule, "one chip design" for optionally changing over a combination of the I/O structure and the column address structure has become a main stream.

For example, in the case of 256 M bit synchronous DRAM of 4 bank structure(hereinafter referred to as a SDRAM), for example, the following three products are manufactured; 64M×4 bit having an I/O structure of 4 banks×13 bit rows×11 bit columns×4 bits, 32M×8 bits having an I/O structure of 4 banks×13 bit rows×10 bit columns×8 bits and 16M×16 bits having an I/O structure of 4 banks×13 bit rows×9 bit columns×16 bits. These three products are constituted in such a manner that the assembly of the I/O structure and the row address structure can be switched over inside. As means for switching over the I/O structure and the row address structure, for example, a mask option at the time of forming an upper layer wiring, a wire bonding option, and an inside fuse blowing option or the like can be given. It becomes possible to meet the demand of customers by changing over the I/O structure and a column address structure with these options at the final stage of the manufacture step.

In this manner, in the one-chip design semiconductor memory device, the column address structure is defined depending upon the I/O structure. Therefore, hereinafter, the switch-over of the I/O structure and the row address structure is simply referred to as the switch-over of the I/O structure.

In the above I/O structure, the test time becomes longest in the minimum number of data which is accessed in parallel in one time data reading/writing cycle. That is, in the above example, there is shown a 4 bit I/O structure product which has the minimum I/O number. In the 4 bit I/O structure product, the I/O number which can be accessed in the same cycle at the same time can be decreased to ¼ as compared with the 16 bit I/O structure.

Consequently, the memory product with the I/O structure having a small bit with (the minimum is 4 bits after the 64 M bit product), the test time becomes extremely long along with the increase in the capacity. Therefore, there is a problem that the test cost increases.

Many DRAM's have shortened the test time by using a test mode such as an address compression, a parallel I/O or the like through the introduction of the test mode circuit into the data bus of an internal circuit. However, it has been extremely difficult to equalize the test time of the 4 bit I/O product to the test time of 16 bit I/O product.

In particular, along with an increase in the speed of the DRAM in recent years, it is necessary to ensure an operation timing at 100 MHz and 150 MHz. However, the test mode circuit normally has a complicated logic. Furthermore, in many cases, a high speed operation in the critical path cannot be actually confirmed. Therefore, it has been difficult to add a test mode circuit for ensuring the high speed operation of the product.

Even with the memory product having a different I/O structure, the external configuration of the package sealing the semiconductor chip is the same in almost all the cases when the memory capacity is the same. Therefore, the number of pins of each package is the same as well. For example, in 256 M bit SDRAM, all the same pin number package is used with respect to the products having an I/O number of ×4 bits, ×8 bits and ×16 bits.

For example, in the single data rate (hereinafter referred to as SDR) SDRAM, 54 pin TSOP (Thin Small Outline Package) is used. In the double data rate (hereinafter referred to as DDR) SDRAM, 66 pin TSOP package is used.

With respect to products having a small I/O number of 4 bits and 8 bits, an unnecessary I/O pin is generated as compared with the products having a large I/O number of 16 bits. These unnecessary I/O pins are not used as an NC (Non-connect). Therefore, there is no bonding wire connecting the lead frame corresponding to these unnecessary I/O pins to the bonding pad.

Figure 14:
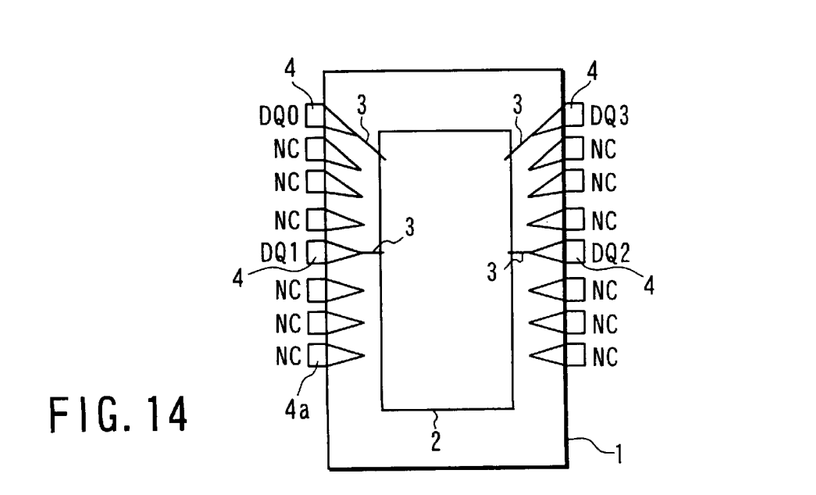
FIG. 14 is a plan view showing a wire bonding of the semiconductor memory device having a conventional 4 bit I/O structure.

FIG. 14 is a schematic view showing a case in which semiconductor chip having an I/O number of ×4 bits is accommodated in a sealing package having an I/O number of ×16 bits in one chip design semiconductor memory device. In this figure, only the I/O pin is noted, and there is shown a state in which the I/O pin is wire bonded to the semiconductor chip having an I/O number of 4 bits.

FIG. 14 shows a package 1, a semiconductor ship 2, bonding wires 3, and 16 I/O pins. Four DQ pins 4 comprising $DQ_0$, $DQ_1$, $DQ_3$ and $DQ_4$ in these I/O pins are connected to a pad (not shown) with the bonding wire 3. To the remaining twelve NC pins 4a, no bonding wire 3 is connected.

16 I/O pins are prepared for the semiconductor chip having an I/O number of ×16 bits. However, to the semiconductor chip having an I/O number of 4 bits shown in FIG. 14, only four I/O pins (DQ pin 4) are connected to the bonding pad (not shown) of the semiconductor chip 2 via the bonding wire 3. Consequently, the other I/O pins (NC pin 4a) are not used.

In this manner, with the semiconductor memory device for switching over the I/O number with an option of the conventional wire bonding, a function test of the semiconductor memory device cannot be conducted by switching over the I/O number after the sealing of the package or after the assembly thereof.

Figure 15:
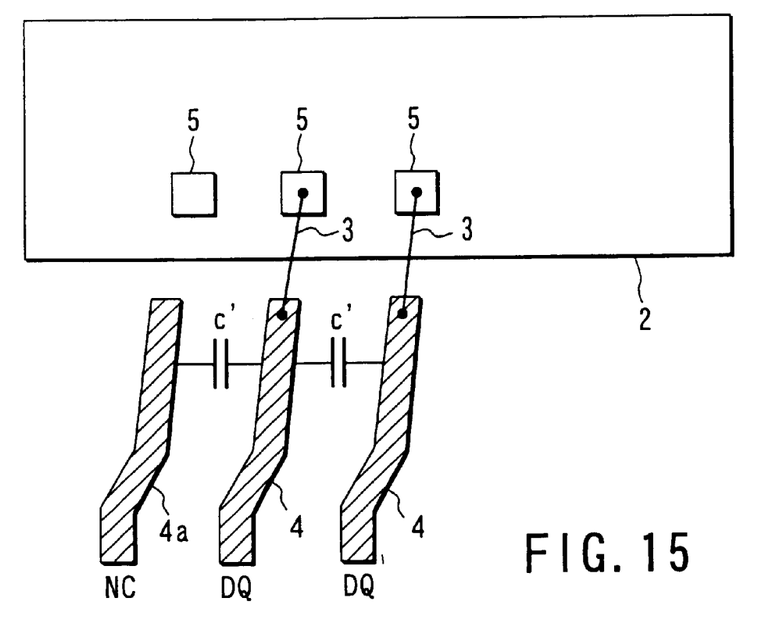
FIG. 15 is a view for explaining a change in an input capacity of the wire bonding of the conventional semiconductor memory device.

Next, by using FIG. 15, there will be explained other problems generated when the I/O number is switched over in an option of wire bonding. In FIG. 15, the input capacity generated in the I/O pin changes at the time of the connection of the bonding pad 5 formed on the semiconductor chip 2 with the I/O pin formed of a lead frame. FIG. 15 is a view showing a DQ pin 4 connected at the bonding wire 3 and the NC pin 4a which is not connected.

As described above, in the product having an I/O number of 16 bits, all 16 I/O pins of FIG. 14 are connected with the bonding wire 3 like DQ pin 4 shown in FIG. 15. On the other hand, the product in which the I/O number is switched over to ×4 bits or ×8 bits includes a NC pin 4a which is not connected with the bonding wire 3.

The NC pin 4a is set to a floating state because the pin is not connected to the fixed potential. Consequently, as shown in FIG. 15, the component of the adjacent term C of the package capacity between the NC pin 4a and the DQ pin 4a in the adjacent I/O product of ×4 bit or ×8 bit is smaller than the component C of the adjacent term of the package capacity of the DQ pin 4 in the 16 bit I/O product (not shown) connected with the bonding wire 4.

In this manner, when the I/O number is switched over in an option of the wire bonding, the semiconductor chip of 4 bits or 8 bits is the same as 16 bit I/O product. However, the input capacity of the DQ pin 4 of I/O product of 4 bits or 8 bits becomes smaller than the 16 bit I/O product.

Hereinafter, referring to the drawings, embodiments of the present invention will be explained in detail.

Figure 1:
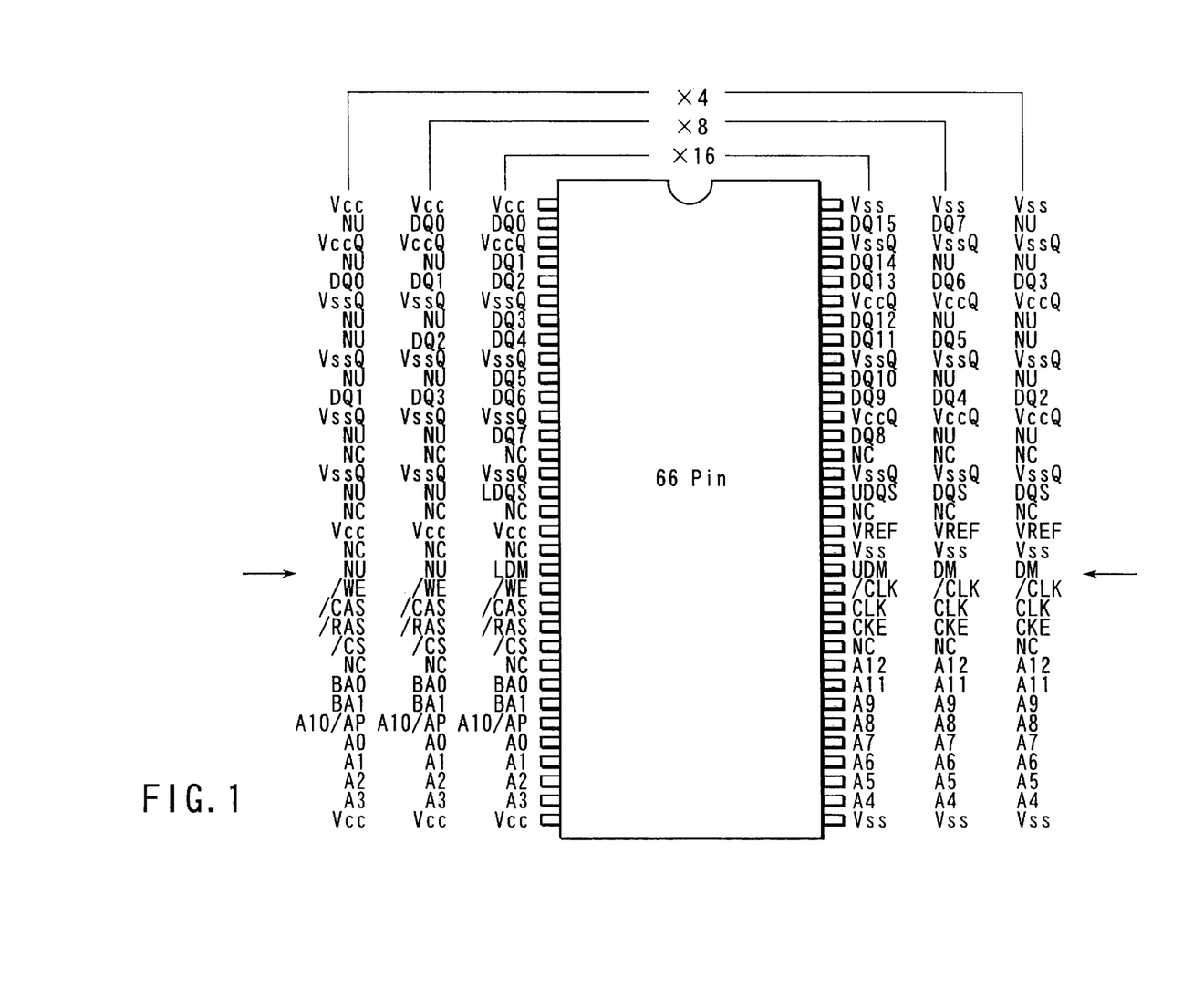
FIG. 1 is a view for explaining a pin arrangement of a semiconductor memory device having a ×4, a ×8, and a ×16 bit I/O structures according to a first embodiment of the present invention.

FIG. 1 is a view showing one example of a pin arrangement of a package of a semiconductor memory device according to an embodiment of the present invention. In the one-chip design semiconductor memory device shown in FIG. 1, a 256 M bit DDR SDRAM chip is sealed into a 66 pin common package as a ×4 bit, a ×8 bit, or a ×16 bit I/O structure.

In FIG. 1, Vcc and Vss are the power source and the ground pin, respectively. DQ0 through DQ15 are wire bonded I/O pins (DQ pins) for inputting and outputting the read/write data and test data. The NU (Not-Used) pin of the ×4 bit or the ×8 bit I/O product is wire bonded in the same manner as the corresponding pin of the ×16 bit I/O product. However, the pin is an I/O pin (NU pin) which is not used in the input and output of read/write data with the function of the inside circuit. Incidentally, in the package shown in FIG. 1, the NC is an excess pin which is not wire bonded.

/CAS,/RAS,/CS are a pin for a column address strobe signal, a pin for a row address strobe signal, and a pin of a chip select signal, respectively. Reference numerals A0 through A12 denote address pins which include a pin for a column address.

CLK denotes an input pin of a clock signal, and others are input pins of various signal required for an operation of a DDR SDRAM. However, the input pins are not directly associated with the operation of the semiconductor memory device of the present invention. An explanation thereof will be omitted here. Incidentally, the present invention is not particularly limited to the semiconductor memory device comprising a 256 M bit DDR SDRAM. Therefore, except for necessary cases, the invention is explained as a semiconductor memory device simply comprising a semiconductor chip.

Next, using FIGS. 2 and 3, there will be explained wire bonding in a one chip design semiconductor memory device according to a first embodiment of the present invention.

Figure 2:
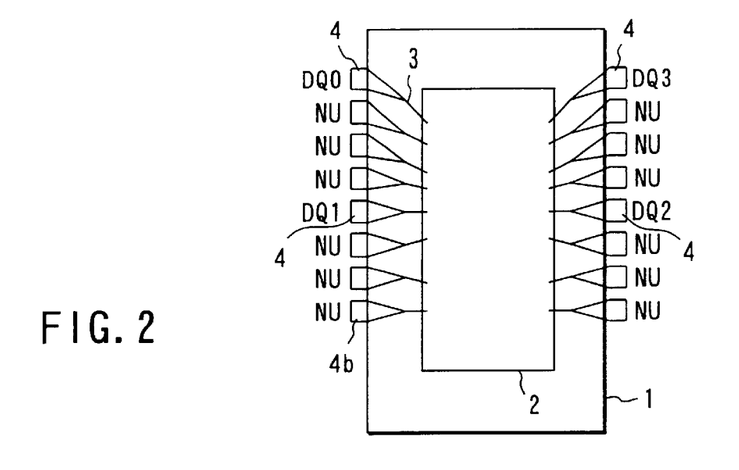
FIG. 2 is a plan view showing a wire bonding of a semiconductor memory device having a ×4 bit structure according to the first embodiment.

FIG. 2 is a schematic view showing an internal structure of a package. FIG. 2 is a view showing a case in which wire bonding is provided on a semiconductor chip in which the I/O number is switched over to ×4 bit by using a sealed package having an I/O number of 16 bits. FIG. 2 is a view showing a state in which wire bonding is provided on the semiconductor chip particularly by noting the I/O pin. Incidentally, in FIG. 2, same portions in FIG. 13 are denoted with same reference numerals, and an explanation thereof will be omitted.

As shown in FIG. 2, in the first embodiment, with respect to the semiconductor chip in which the I/O number is switched over to ×4 bit unlike the prior art, all the 16 I/O pins are connected with wire bonding in the same manner as the semiconductor chip having an I/O number of ×16 bits. Out of them, to four DQ pins 4 comprising DQ0, DQ1, DQ2, and DQ3, the read/write data having a 4 bit structure is input and output. However, to other 12 NU pins 4b, the read/write data is not input and output with the function of the internal circuit provided on the semiconductor chip.

On the other hand, in the test mode, with the function of the inside circuit provided on the semiconductor chip, 4 bit test data is input and output via the DQ pin 4. Furthermore, the NU pin 4b which is not used in the read/write operation of the 4 bit I/O structure read/write operation is used so that the ×8 bit or ×16 bit test data can be input to and output from the memory cell.

Next, by using FIG. 3, the wire bonding according to the first embodiment will be explained in detail by taking one chip design 8 bit I/O product as a specific example. In this case, the pin function will be as shown as ×8 in FIG. 1. FIG. 3 is a view showing only a part of FIG. 1.

Figure 3:
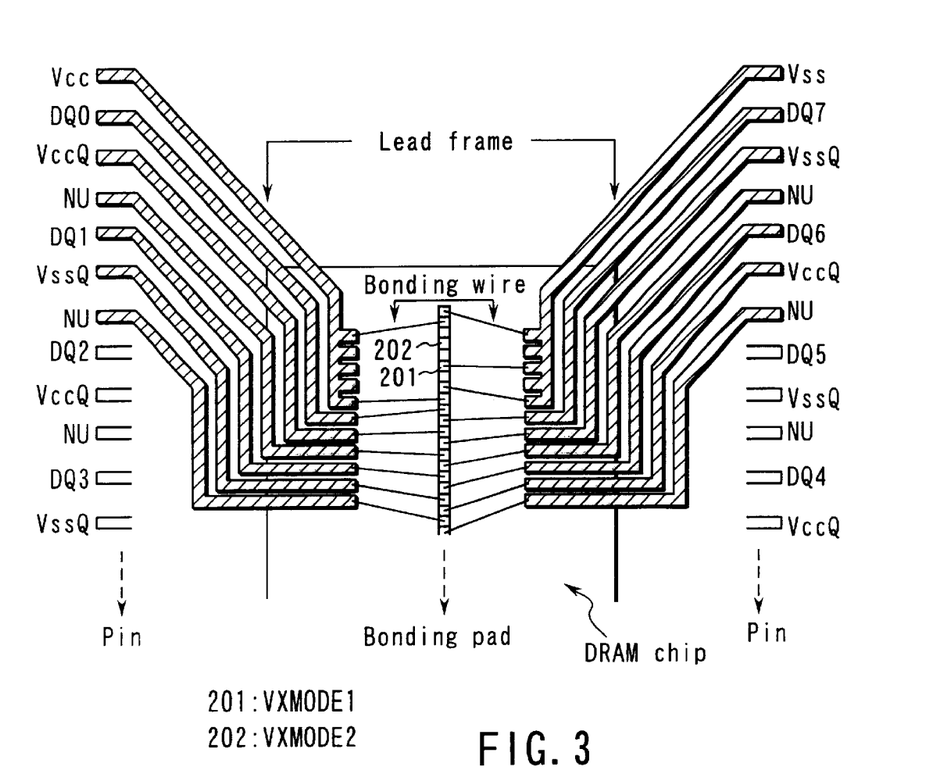
FIG. 3 is a plan view showing a wire bonding of the semiconductor memory device having a ×8 structure according to the first embodiment.

In the 256 M bit DDR SDRAM having an 8 bit I/O structure which is sealed into the 66 pin TSOP package shown in FIG. 3, all the pins are connected to the pad with wire bonding. Consequently, like the conventional 8 bit I/O product shown in FIG. 15, there is no NC pin which is not connected to the pad with the bonding wire (however, excluding the excess NC pin shown in FIG. 1). Consequently, the NC pin shown in FIG. 15 is connected to the I/O pad on the semiconductor chip with the bonding wire to provide the NU pin in FIGS. 1 and 3.

Furthermore, in the first embodiment, the semiconductor memory device which is switched over to one chip 8 bit I/O structure is also constituted so that 16 bit I/O structure is provided at the time of the test mode. That is, 16 I/O pads provided on the semiconductor chip are connected to 16 I/O pins of the TSOP package with the bonding wire, respectively. Other pin arrangement and the wire bonding method are the same as FIG. 15, and an explanation thereof will be omitted here. Consequently, in the semiconductor memory device shown in FIG. 3, the connection of the I/O pad and the I/O pin with the bonding wire are the same as the 16 bit I/O product. However, only 8 DQ pins DQ0 through DQ7 out of 16 I/O pins shown in FIG. 1 becomes effective with respect to the input and output of the memory data by connecting the bonding pad VXMOBE1 201 as an option on the semiconductor chip to Vss.

Other 8 I/O pins which become invalid by the connection of the VXMOBE1 201 to Vss is also connected to the I/O pad with the bonding wire. However, these eight I/O pins are not used at the time of reading and writing of the stored data in accordance with the specification of the 8 bit I/O structure. Consequently, these 8 I/O pins become NU pin.

As shown later, these 8 NU pins enable the input and output of the test data together with 8 DQ pins with the inside circuit provided on the semiconductor chip in the test mode of the semiconductor memory device which is switched over to the 8 bit I/O structure. Therefore, ×16 bits test data is provided by expanding test data. By using this test data, the test time of the semiconductor memory device having an 8 bit I/O structure can be shortened. Furthermore, it is possible that ×8 bit test data is used to contribute to the test of the critical path of a high speed operation.

Furthermore, as shown in FIG. 3, in the conventional one chip design, the I/O pin of the TSOP package which is set to NC (see FIG. 15) are all connected with the bonding wire to provide an NU pin. Consequently, the potential of pins on both sides of each of DQ pins is established with respect to all the DQ pins of the 8 bit I/O product from DQ0 through DQ7. Consequently, the dispersion in the input capacity of the DQ pin can be largely decreased. Therefore, the specification of the DDR SDRAM can be satisfied in each of the I/O structures.

Incidentally, FIG. 3 is a view showing an example of the 256 M bit DDR SDRM which is sealed in the TSOP package. However, the embodiment is not limited thereto. For example, the semiconductor chip can be directly packaged via the solder bump or the like by using the CSP package. Even in such embodiment, a dispersion in the input capacity of the DQ pin can be alleviated.

Next, one example of the I/O structure switch-over circuit (IOSW) of the semiconductor chip according to the first embodiment and an operation thereof will be explained by using FIGS. 4 through 6. The circuit shown in FIG. 4 is a circuit which realizes the semiconductor memory device having a 4 bit, a 8 bit or a 16 bit structure with one chip design by using an option of the wire bonding.

This switch-over circuit having an I/O structure comprises P-channel transistors 6 and 16 connected to the power source, inverter circuits 7 and 17, low pass filters 8 and 18 having the gate electrode of the N-channel transistor as a capacitor, inverter circuits 9 and 19, an EXNOR gate 10, NAND gates 11, 12, 20, 21, and 22, inverter circuits 13 through 15 and inverter circuits 22 through 27.

Figure 4:
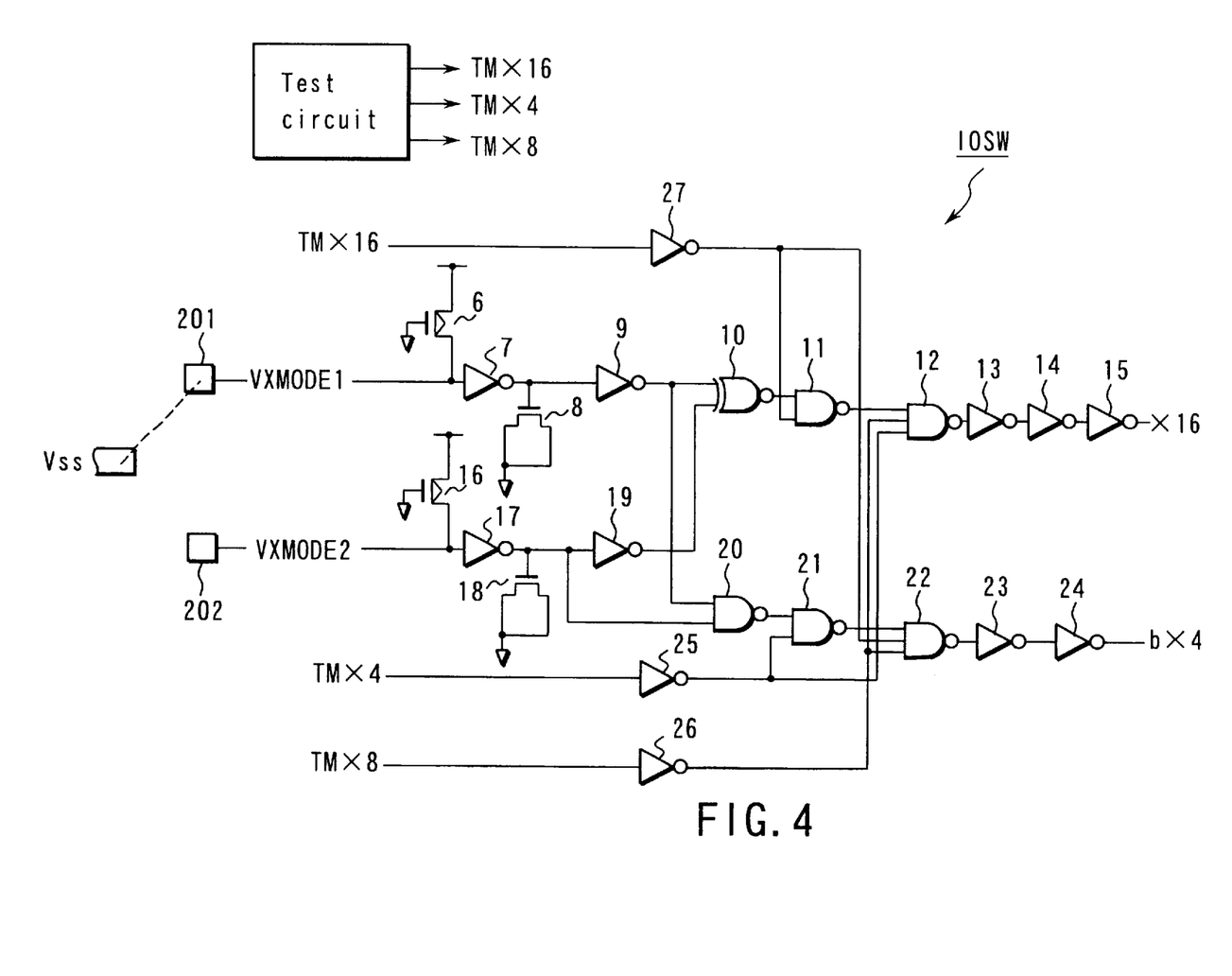
FIG. 4 is a circuit diagram showing an I/O structure switch-over circuit according to the first embodiment.

As shown in FIGS. 3 and 4, option bonding pads VXMOBE1 201 and VXMOBE2 202 on the semiconductor chip are arranged in the vicinity of the pull-out wiring Vss having a reference ground potential. In accordance with the specification of the I/O structure of the semiconductor memory device, one of the VXMOBE1 201 and the VXMOBE2 202 is connected to the reference ground potential Vss with bonding wire. In this circuit, a level of the set control signals X16 and bX4 for setting the I/O structure is set in accordance with the connection state of the option bonding pads VXMOBE1 201 and VXMOBE2 202.

In the I/O structure switch-over circuit shown in FIG. 4, the signals TMX4, TMX8 and TMX16 are I/O structure selection signals output from the test circuit at the time of the test mode. That is, signals TMX4, TMX8 and TMX16 are selection signals for selecting the I/O structure in the test mode. Using these signals TMX4, TMX8 and TMX16, the I/O structure can be set without depending upon the connection of the option bonding pads VXMOBE1 201 and VXMOBE2 202 at the time of the test mode.

Figure 5:
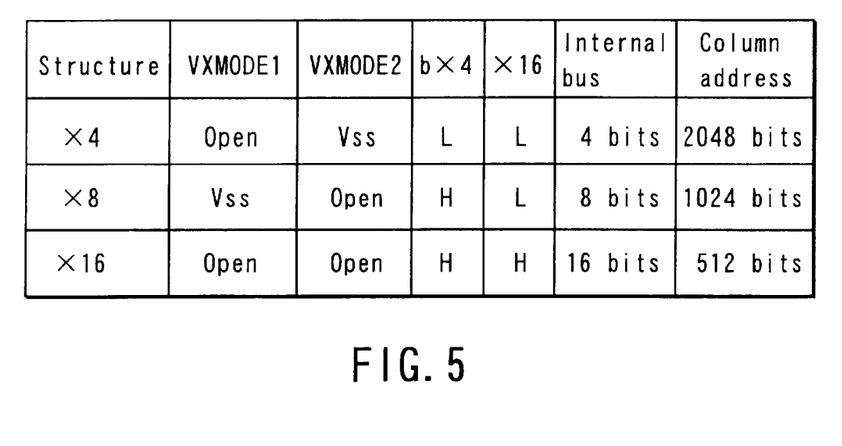
FIG. 5 is a view for explaining an operation of the I/O structure switch-over circuit according to the first embodiment.

FIG. 5 is a view showing a column address bit structure which is defined depending upon the presence of the bonding with respect to the VXMOBE1 and VXMOBE2, the output levels of the set control signal X16, bX4 and the inside bus structure (I/O structure) set with these control signals.

In FIG. 5, Vss in the column of VXMOBE1 and VXMOBE2 shows that these bonding pads are connected to the reference ground potential Vss. Open shows that these bonding pads are not connected to the Vss. Furthermore, symbols "L" and "H" denote a low level and a high level respectively.

FIG. 5 is a view showing a setting process of the I/O structure of the semiconductor memory device in one chip design. At this time, in the circuit shown in FIG. 4, the I/O structure selection signals TMX4, TMX8 and TMX16 in the test mode of the semiconductor memory device are all on low levels.

In the case where the I/O structure is set to 4 bits in the test mode of the semiconductor memory device, the selection signal TMX4 of the I/O structure is set to a high level while the signals TMX8 and TMX16 are set to a low level. Furthermore, when the I/O structure is set to 8 bits, the signal TMX8 is set to a high level, and the signals TMX4 and TMX16 are set to a low level. Furthermore, when the I/O structure is set to 16 bits, the signal TMX16 is set to a high level while the signals TMX4 and TMX8 are set to a low level.

When the I/O structure selection signal in the test mode is set as described above, the semiconductor memory device can be forcibly tested in 4 bit, 8 bit, and 16 bit I/O structure however the VXMOBE1 and VXMOBE2 are bonded.

Figure 6A:
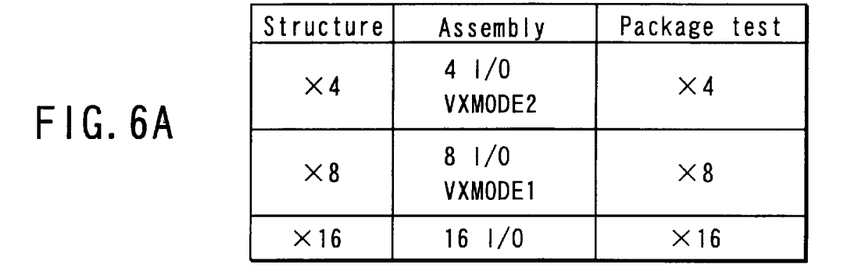
FIG. 6A is a view for explaining a conventional package test.
Figure 6B:
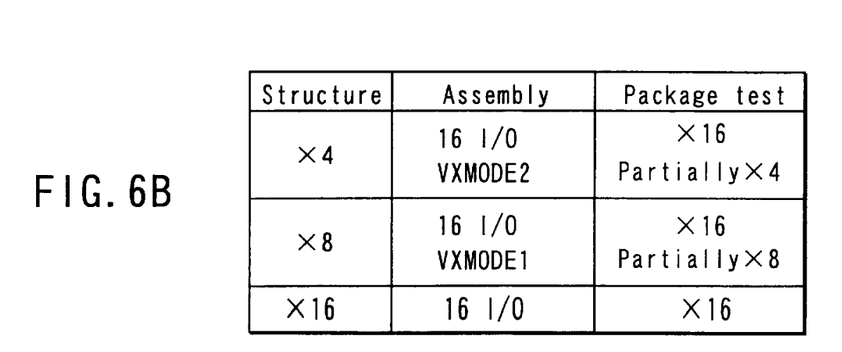
FIG. 6B is a view for explaining a package test of the present invention.

FIGS. 6A and 6B are views showing a comparison between the present invention and the prior art with respect to the presence of the wire bonding to the bonding pad VXMOBE1 and VXMOBE2 at the assembly step of the semiconductor memory device, the wire bonding to the I/O pin of the package in accordance with the specification of the I/O structure of the semiconductor memory device, and the bit structure of the test signal after the assembly step.

As shown in FIG. 6A, in the conventional one chip design, at the assembly step, wire bonding is provided to the I/O pin of the package in accordance with the specification of the 4 bit, the 8 bit or the 16 bit I/O structure. Furthermore, with the presence of the bonding to the pad VXMOBE's 1 and 2, the I/O structure of the semiconductor memory device is established.

At this time, after the assembly step, the wire bonding to the I/O pin of the package is fixedly provided. Therefore, the package test is conducted by using the ×4 bit, the ×8 bit, or the ×16 bit test data respectively in accordance with the specification of the I/O structure. Therefore, there is a problem that the test time becomes long especially with respect to the 4 bit and the 8 bit I/O products.

On the other hand, in one chip design of the present invention shown in FIG. 6B, a wire bonding to the I/O pin of the package is conducted with respect to the 4 bit and the 8 bit I/O product in accordance with the specification of 16 bit I/O structure. Furthermore, the I/O structure of the semiconductor memory device is established with the presence of the bonding to the pads VXMOBE1 and 2.

Furthermore, after the assembly step, the wire bonding to the I/O pin of the package is conducted in accordance with the specification of the 16 bit I/O structure. Therefore, in the test mode, the package test can be conducted with the bit width of the ×4 bit, the ×8 bit, or the ×16 bit width by designating the I/O structure selection signals TMX4, TMX8 and TMX16. Therefore, in particular, with respect to the 4 bit and the 8 bit I/O product, the package test with ×16 bit width can be conducted. Consequently, in this case, the test time can be largely reduced.

Incidentally, in the test mode of the semiconductor memory device according to the present invention, a ×4 bit or a ×8 bit package test is used as a function test of a part of a critical path which requires particularly a high-speed test. A function test of such high-speed critical path is conducted with respect to only part of the semiconductor memory device. Therefore, the whole test time is not largely affected with this test.

Next, by using FIG. 7, a structure example of a data input circuit (DIN) of the semiconductor chip according to the first embodiment and an operation thereof will be explained. This data input circuit receives set control signals X16 and bX14 output from the I/O structure switch-over circuit and avoids error writing of data to the NU pin which is not used in the 4 bit and the 8 bit I/O products.

Conventionally, in one chip design, no wire bonding is provided to the NC pin which is not used in the 4 bit or the 8 bit I/O product. Therefore, there is no fear at all of error writing on the NC pin. However, the semiconductor memory device according to the present invention conducts all wire bonding by using these NC pins as NU pins. Therefore, it is necessary to provide a circuit for prohibiting error writing with the data supplied by the NU pin.

Figure 7:
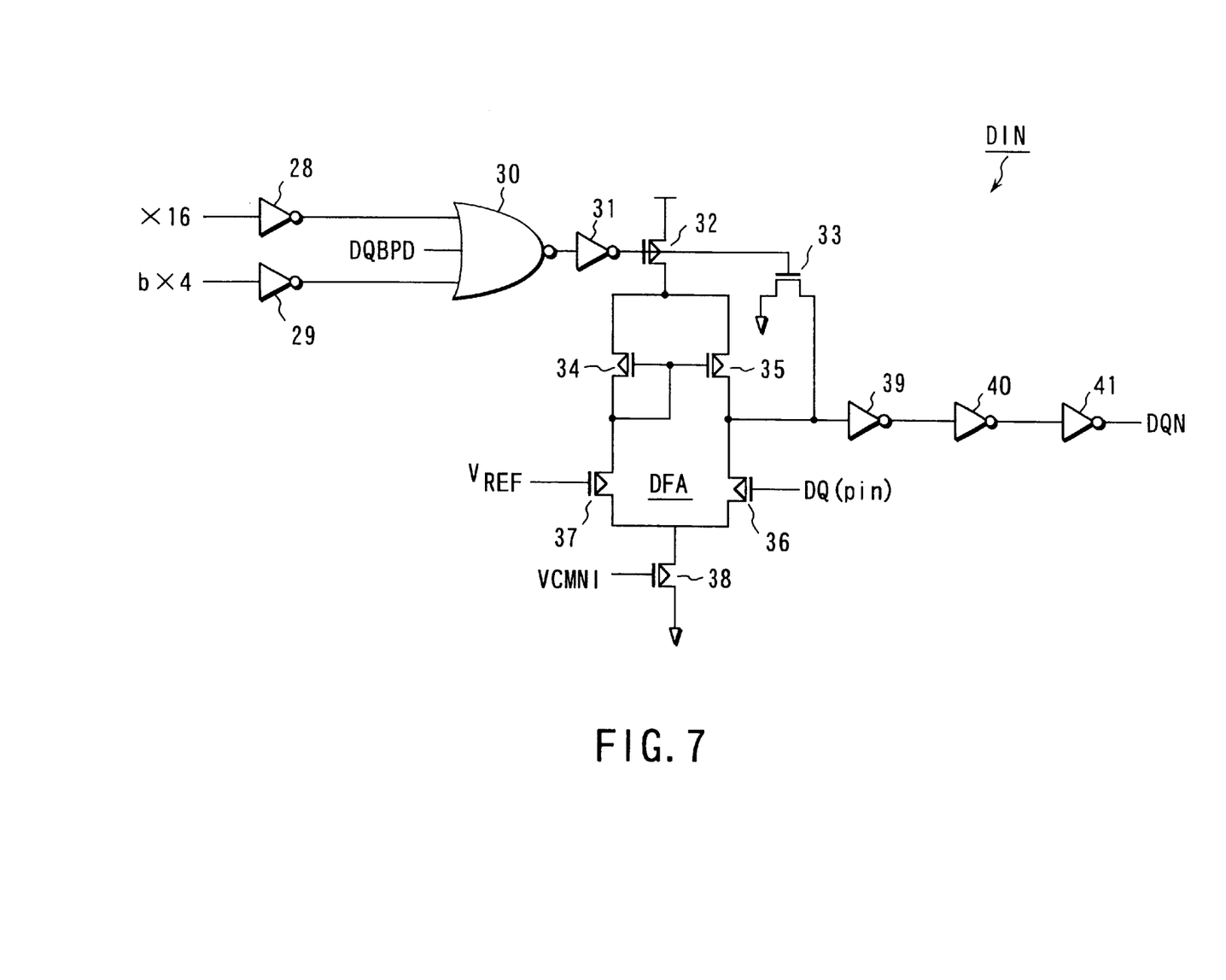
FIG. 7 is a circuit diagram showing a writing data input circuit according to the first embodiment.

In FIG. 7, on the input terminal of the inverter circuits 28 and 29, the set control signals X16 and bX4 are supplied for setting the I/O structure. An output signal of these inverter circuits 28 and 29 and an enable signal DQSPO of the bank activation are supplied to the input terminal of the NOR gate 30. The output signal of this NOR gate 30 is supplied to the gate of the P-channel transistor 32 via the inverter circuit 31. This P-channel transistor 32 is ON and OFF controlled with an output signal of the inverter circuit 31.

The P-channel transistor 32 is a current source of a differential amplifier DFA. This differential amplifier DFA comprises P-channel transistors 34 and 35, and P-channel transistors 36, 37 and 38. The reference voltage $V_{REF}$ is supplied to the gate of the P-channel transistor 37, and the write data signal from the DQ pin is supplied to the gate of the P-channel transistor 36. Furthermore, the signal VCMNI is supplied to the gate of the P-channel transistor 38. The P-channel transistor 32 controls the write data supplied to the inside of the semiconductor chip from the DQ pin by controlling the current supply to the differential amplifier DFA in accordance with the set control signals X16, bX4 and the signal DQBPD. To the output terminal of the differential amplifier DFA, inverter circuits 39, 40 and 41 are connected in series. The output signal of the inverter circuit 41 is transmitted to the DQN.

Furthermore, an N-channel transistor 33 is connected between the output terminal of the differential amplifier DFA and the ground. To the gate of this N-channel transistor 33, an output signal of the inverter circuit 31 is supplied. This N-channel transistor 33 grounds the output terminal of the differential amplifier DFA in accordance with the output signal of the inverter circuit 31. Therefore, when the N-channel transistor 33 is turned on, the input of the write data into the semiconductor chip from the DQ pin is prohibited.

In the semiconductor memory device according to the first embodiment, 16 data input circuits are provided corresponding to DQ0 through DQ15 pins on the semiconductor chip. These data input circuit DIN allow the data input from the DQ pin of the package in accordance with the set control signals X16 and bX4 and prohibits the data input from the NU pin. Therefore, the error writing with data supplied from the NU pin can be prohibited.

Figure 8:
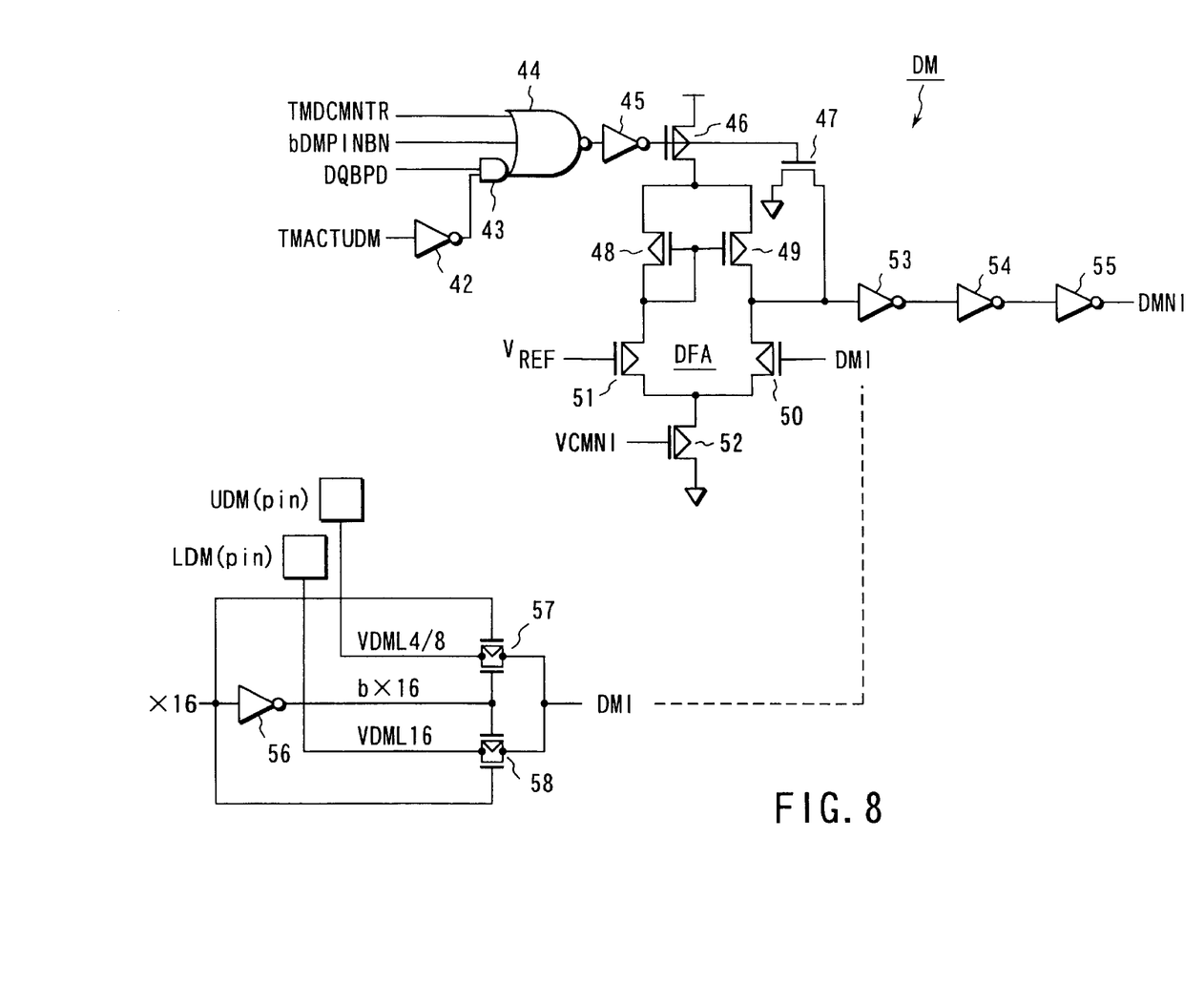
FIG. 8 is a circuit diagram showing an input buffer circuit for data mask according to the first embodiment.

FIG. 8 is a view showing a write data mask input buffer circuit (DM) which is applied to the first embodiment. With respect to this data mask input buffer circuit, there is shown a structure example in the case of the DDR SDRAM.

The input buffer circuit shown in FIG. 8 receives the set control signals X16 and bX4 for setting the I/O structure to mask write data with respect to the 4 bit and 8 bit I/O structure products. The UDM (pin) is a DM pin for masking data of the I/O pins DQ8 through DQ15 at the upper position in the I/O structure. The LDM (pin) is a DM pin for masking the I/O pins DQ0 through DQ7 at the lower position in the 16 bit I/O structure. In this manner, the upper position data and the lower position data can be independently masked by using the UDM (pin) and LDM (pin).

Furthermore, as shown by an arrow in FIG. 1, in the case of the 4 bit or the 8 bit I/O structure, the LDM (pin) becomes NU. With only the UDM (pin), 4 I/O's and 8 I/O's are masked. Conventionally, in the case of the 4 bit or 8 bit I/O structure, the LDM (pin) becomes NC and no wire bonding is provided. However, in the semiconductor memory device according to the first embodiment, the LDM (pin) is wire bonded in the same manner as in the structure of 16 bit I/O structure. An output of the data mask signal DMI is controlled in accordance with the set control signal X16 of the I/O structure shown in FIG. 8.

That is, in the output circuit of the data mask signal DMI shown in a lower portion of FIG. 8, in the case of the 4 bit or the 8 bit I/O structure, the set control signal X16 of the I/O structure is set to a low level. Consequently, the transfer gate 57 is set to an ON state while the transfer gate 58 is set to an OFF state. Consequently, even when the transfer gate is wire bonded in the same manner as in the 16 bit I/O structure, only the UDM (pin) signal is output as the data mask signal DMI. Therefore, the data mask input buffer circuit shown in an upper portion of FIG. 8 can be operated in the same manner as in the UDM data mask buffer circuit.

A main portion of the data mask input buffer circuit shown in an upper portion of FIG. 8 receives data mask signal DMI to output N-th data mask control signal DMNI. This data mask input buffer circuit has an input portion comprising an inverter circuit 42, an AND gate 43, and a NOR gate 44, and the output terminal of the NOR gate 44 is connected to the input terminal of the inverter circuit 45. The signal TMAC-TUDM is a signal for activating the UDM (pin), for example, at the time of the test mode. The signal TMDC-MNTR and the signal bDMPINBN are signals which are fixed to a low level. In the data mask input buffer circuit, circuits after the inverter circuit 45 is basically the same as the circuit structure shown in FIG. 7. Consequently, detailed explanation thereof will be omitted.

Figure 9:
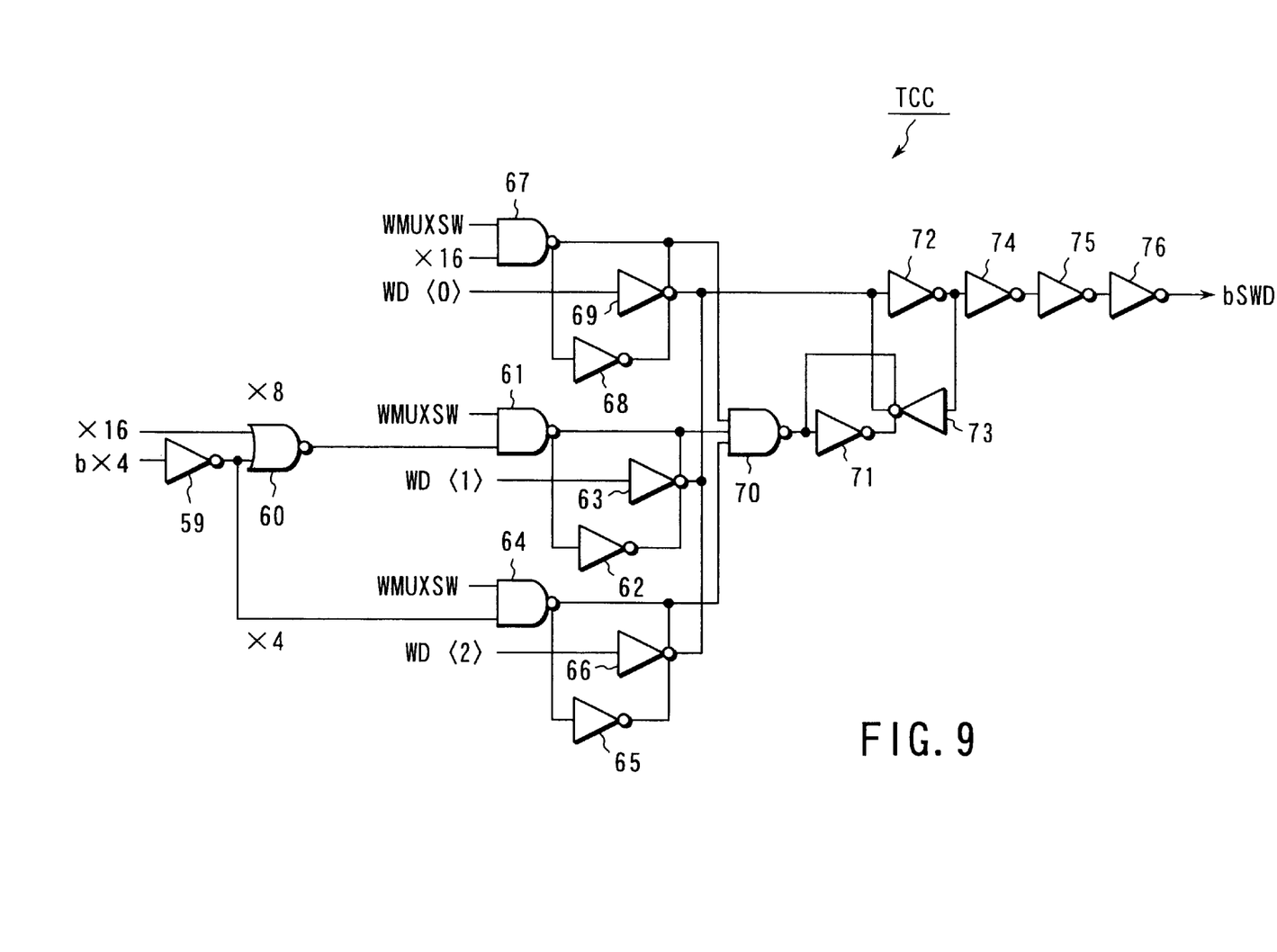
FIG. 9 is a circuit diagram showing a data multiplexing transmission circuit according to the first embodiment.

FIG. 9 is a view showing one example of a transfer circuit (TCC) which is applied to the first embodiment. This transfer control circuit controls the transfer of the masked write data with respect to a memory core portion. The transfer control circuit of he write data shown in FIG. 4 multiplexes an output of the data mask input buffer circuit which is suspended in operation in the 4 bit or the 8 bit I/O structure and an output of the data mask input buffer circuit for data mask in the 4 bit or the 8 bit I/O structure to be transmitted to the memory core portion.

In the transfer control circuit shown in FIG. 9, the transfer channel WD <0> of the write data of 16 bit I/O structure is connected to the input terminal of the clocked inverter circuit 69. This clocked inverter circuit 69 is controlled with a logic circuit comprising a NAND gate 67 and the inverter circuit 68. A multiplexed signal WMUXSW and set control signal X16 are supplied to the input terminal of the NAND gate 67.

The transfer channel WD <1> of write data of 8 bit I/O structure is connected to the input terminal of the clocked inverter circuit 63. The clocked inverter circuit 63 is controlled with the logic circuit comprising an inverter circuit 59, a NOR gate 60, an NAND gate 61 and an inverter circuit 62. The set control signal bX4 is supplied to the input terminal of the inverter circuit 59. An output signal of the inverter circuit 59 and the set control signal X16 are supplied to the input terminal of the NOR gate 60. An output signal of the NOR gate 60 and the multiplexed signal WMUXSW are supplied to the input terminal of the NAND gate 61.

The write data transfer channel WD <2> of the 4 bit I/O structure is connected to the inverter circuit 66. This clocked inverter circuit 66 is controlled with a logic circuit comprising the inverter circuit 59, the NAND gate 64, and an inverter circuit 65. To the input terminal of the NAND gate 64, an output signal of the inverter circuit 59 and the multiplexed signal WMUXSW are supplied. The output terminal of the clocked inverter circuits 69, 63 and 66 are connected to the input terminal of the inverter circuit 72. To this output terminal of this inverter circuit 72, inverter circuits 74, 75 and 76 are connected in series.

Output signals of the NAND gates 67, 61 and 64 are supplied to the input terminal of the NAND gate 70. An inverter circuit 71 is connected to the output terminal of this NAND gate 70. To the inverter circuit 72, a clocked inverter circuit 73 is connected in parallel. This clocked inverter circuit 73 is controlled with the output signal of the NAND gate 70 and the output signal of the inverter circuit 71.

The transfer control circuit having the above structure moves write data in the transfer channel WD<2> having the 4 bit I/O structure and the transfer channel WD<1> having the 8 bit I/O structure to the transfer channel WD<0> in accordance with the set control signals X16 and bX4 having the I/O structure and the multiplex signal WMUXSW. Transmissions of write data on the transfer channel WD<0> having the 16 bit I/O structure are controlled by the multiplex signal WMUXSW and set control signal X16. The multiplexed write data bSWD are supplied to memory core.

Figure 10:
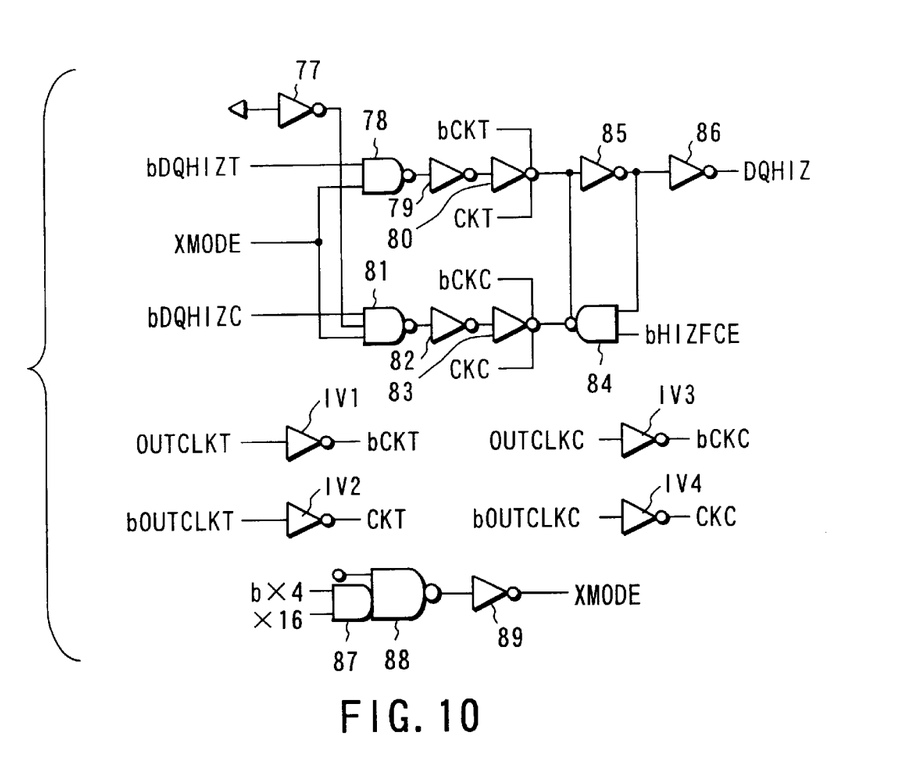
FIG. 10 is a circuit diagram showing an output circuit of a read data control signal according to the first embodiment.
Figure 11:
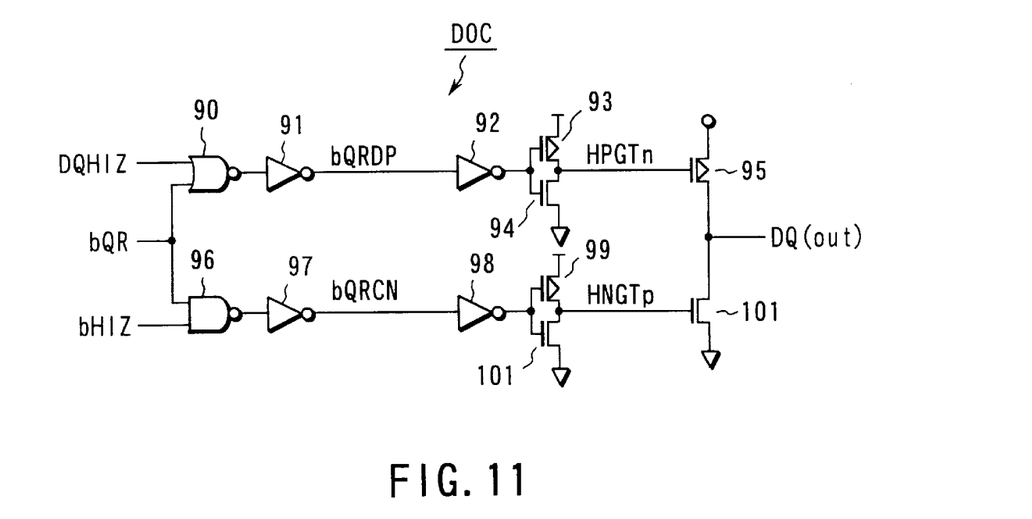
FIG. 11 is a circuit diagram showing a read data output circuit according to the first embodiment.

FIGS. 10 and 11 are views showing one example of a data output circuit of a semiconductor chip according to the first embodiment. This data output circuit avoids error reading of data from the NU pin which is not used in the 4 bit and the 8 bit I/O structure products in accordance with the set control signal X16 and bX4 of the I/O structure in one chip design.

In the conventional one chip design, the bonding wire is not connected to the NC pin which is not used in the 4 bit and 8 bit I/O structure products. Therefore, there is no fear at all error reading from the NC pin. However, in the semiconductor memory device according to the present invention, all the bonding wires are connected by using the conventional NC pins as NU pins. Therefore, like the error writing prohibiting circuit which is explained by using FIG. 7, it is necessary to provide a circuit for prohibiting error reading of the data from the NU pin.

A circuit comprising an AND gate 87, a NAND gate 88, and an inverter circuit 89 generates a reading control input signal XMODE in accordance with the set control signals X16 and bX4 having the I/O structure.

A generating circuit of the reading control output signal DQHIZ shown in FIG. 10 comprises, for example, an inverter circuit 77, NAND gates 78 and 81, inverter circuits 79 and 82, clocked inverter circuits 80 and 83, the NAND gate 84, and inverter circuits 85 and 86. To the input terminal of the NAND gate 78, the signal bDQHIZT is supplied for controlling one of the reading control signals XMODE and DDR. To the input terminal of the NAND gate 81, a signal bDQHIZC is supplied for controlling the other one of the reading control signals XMODE and DDR.

The two inverter circuits IV1 and IV2 shown in FIG. 10 generate respectively signals bCKT an CKT in accordance with the signals OUTCLKT and bOUTCLKT. The clocked inverter circuit 80 is controlled with these signals bCKT and CKT.

Furthermore, two inverter circuits IV3 and IV4 generates respectively signals bCKC and CKC in accordance with the signals OUTCLKC and bOUTCLKC. The clocked inverter circuit 83 is controlled with these signals bCKC and CKC.

FIG. 11 is a view showing a data output control circuit (DOC) using the reading control signal DQHIZ. This data output control circuit comprises a complementary inverter circuit comprising an NOR gate 90, inverter circuits 91 and 92, a P-channel transistor 93 and an N-channel transistor 94, and a complementary inverter circuit comprising an output P-channel transistor 95, a NAND gate 96, inverter circuits 97 and 98, a P-channel transistor 99 and N-channel transistor 100, and the output N-channel transistor 101. The data bQR read from the memory is supplied to the NOR gate 90 together with the reading control output signal DQHIZ. The data bQR is supplied to the NAND gate 96 together with the control signal bHIZ.

In the semiconductor memory device according to the present invention, 16 data output circuits shown in FIG. 11 are provided on the semiconductor chip. That is, each of the data output circuits is provided corresponding to 16 DQ pins. In the circuit shown in FIG. 11, the read data bQR is controlled with the read control output signal DQHIZ generated in accordance with the set control signal bX4 and X16 having an I/O structure at the input stage. Therefore, the output terminal of the data output circuit connected to the DQ pin which is not used in the 4 bit and 8 bit I/O structure is set to a high impedance state. Consequently, an error in reading from the NU pin wire bonded to the DQ pin which is not used in the 4 bit and 8 bit I/O structures can be avoided.

Figure 12:
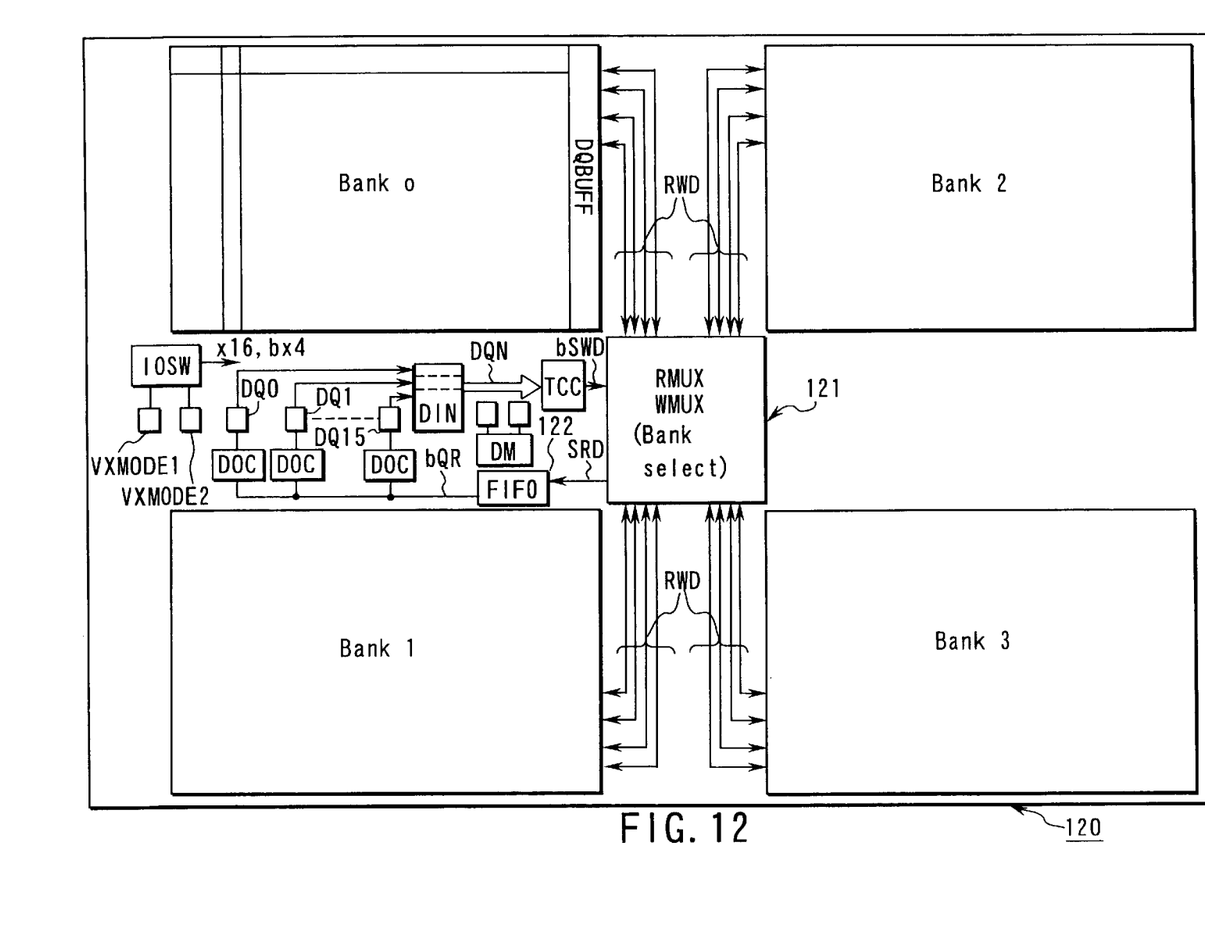
FIG. 12 is a schematic configuration view showing a semiconductor memory device to which each circuit of the first embodiment is applied.

FIG. 12 shows a schematic configuration of a semiconductor memory device to which each of the circuits according to the first embodiment is applied. Same parts from FIGS. 4 to 11 are denoted by same symbols, and an explanation thereof will be omitted. In FIG. 12, four banks Bank 0 through Bank 4 are arranged on the chip 120. On each bank, a plurality of memory cells (not shown) are arranged. To these memory cells, a data line DQ (selectively not shown) is connected each bank. On each bank, a DQ buffer (DQBUF) is provided. To this DQ buffer, the data line DQ is connected. Furthermore, a RWD line is connected to each DQ buffer. These RWD lines are connected to the bank selection circuit 121. This bank selection circuit 121 selects the RWD line corresponding to a predetermined bank in accordance with the bank selection signal. Write data to each bank is supplied to the bank selection circuit 121 via the transfer control circuit (TCC). Furthermore, data read from each bank is supplied to the buffer (FIFO) 122 of first in/first out via the bank selection circuit 121. The data is supplied from this buffer 122 to each data control circuit (DOC) via the circuit 121.

In the first embodiment, each of the pads and each of the pins are all connected. Besides, the switch-over circuit of the I/O structure does not depend upon the option of bonding, and the bit structure can be changed in accordance with the signals TMX16 and TMX8, and TMX4 supplied from the test circuit. Consequently, after the assembly step, the bit structure can be changed. Furthermore, 4 bit and 8 bit I/O product can be tested as a 16 bit I/O structure product. Therefore, the test time of small bit structure product can be reduced so that the test cost can be decreased.

Furthermore, the bonding wire is connected to all the adjacent pins. Consequently, the input capacity in each bit structure can be set approximately to an equal level. Consequently, in one chip design semiconductor memory device, the specification of the input capacity in each of the 16 bit, 8 bit and 4 bit I/O structure products can be satisfied.

Figure 13A:
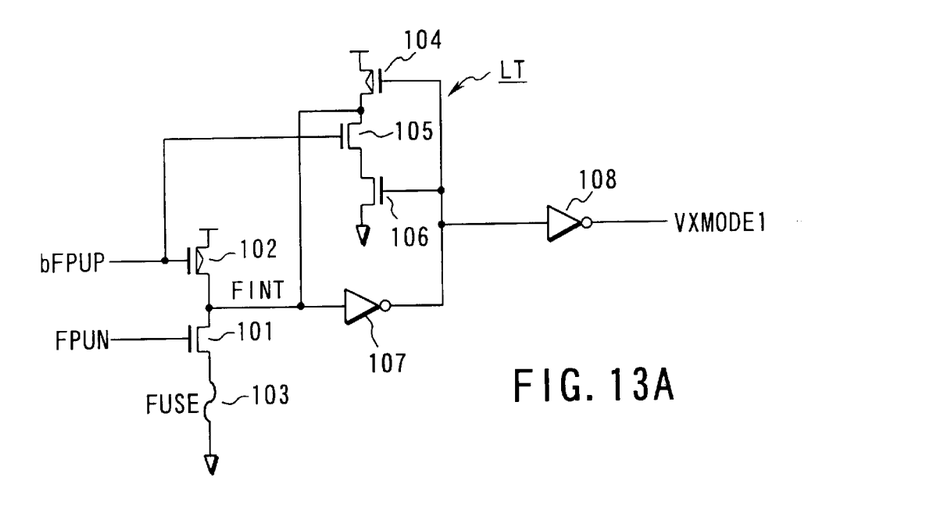
FIG. 13A is a circuit diagram showing an I/O structure switch-over circuit using a fuse according to a second embodiment.
Figure 13B:
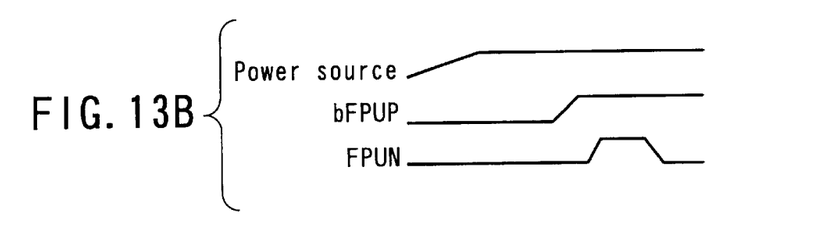
FIG. 13B is a view showing an operation timing of a fuse latch circuit shown in FIG. 13A.

FIG. 13 is a view showing a second embodiment of the present invention.

In the first embodiment, the I/O structure is switched over with the switch-over of the wire bonding with respect to the pad VXMOBE1 or VXMOBE2 on the semiconductor chip. On the other hand, in the second embodiment, a fuse is used, and the I/O structure is switched over by generating the ROM code as an option as to whether this fuse is to be blew or not.

FIG. 13A is a view showing a first latch circuit for generating a signal VXMOBE1. In the same structure as in this first latch circuit, a second latch circuit is also provided for generating the signal VXMOBE2. However, here, there is shown only a first latch circuit.

In FIG. 13A, the P-channel transistor 102, the N-channel transistor 101 and the fuse 103 are connected between the power source and the ground. To the gate of the P-channel transistor 102, an initialization signal bFPUP is supplied while an initialization signal FPUN is supplied to the gate of the N-channel transistor 101. To the connection node of the P-channel transistor 102 and the N-channel transistor 101, a latch circuit LT comprising an inverter circuit 107, a P-channel transistor 104, N-channel transistors 105 and 106 is connected. Furthermore, to the output terminal of the inverter circuit 107, the input terminal of the inverter circuit 108 is connected. From the output terminal of this inverter circuit 108, for example, a signal VXMOBE1 is output.

In the above structure, there will be explained an operation of the first fuse latch circuit.

FIG. 12B is a timing waveform of an initialization signals bFPUP and FPUN. After the power on, the initialization signal bFPUP is set to a high level, followed by setting the initialization signal FPUN to a high level. In the case where the fuse 103 is electrified in the state in which the initialization signal bFPUP and FPUN are supplied in this manner, an output signal FINT of an inverter circuit comprising an N-channel transistor 101 and the P-channel transistor 102 becomes a low level. Consequently, an output signal of the inverter circuit 107 becomes a high level. This signal is latched with the latch circuit LT. Furthermore, the output signal VXMOBE1 of the inverter circuit 108 to which an output signal of this latch circuit LT is supplied is set to a low level.

On the other hand, when the fuse is blew, the signal FINT is set to a high level. This signal is latched with the latch circuit LT. Furthermore, an output signal VXMOBE1 of the inverter circuit 108 to which an output signal of this latch circuit LT is supplied is set to a high level.

The second fuse latch circuit is operated in the same manner as in the first fuse circuit, and the signal VXMOBE2 is set.

When the signal VXMOBE1 is set to a low level, and the signal VXMOBE2 is set to a high level by using the first and the second fuse latch circuits, the semiconductor memory device comes to have a 8 bit I/O structure from FIG. 5.

According to the second embodiment, the first and the second fuse latch circuits are provided to output the output signals VMODE 1 and VMODE 2 as a ROM code corresponding to the electrification and blowing of the fuse. Consequently, with this ROM code, the I/O structure of the semiconductor memory device can be switched over in the same manner as the option of the wire bonding.

Incidentally, the present invention is not restricted to the first and the second embodiment. The first and the second embodiments have been explained by taking a 256 M bit DDR SDRAM having a 4 bit, an 8 bit, a 16 bit I/O structure as a concrete example. However, the present invention can be applied to a DRAM having other I/O structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor chip accommodated in a package;
   n pads provided on the semiconductor chip;
   n pins provided in the package to be connected to ton pads;
   first and second pads provided on to semiconductor chip;
   a switching circuit connected with the first and second pads, the switching circuit switching over a data bit structure so as to input and output data via at least pins (m is a natural number smoller than n) out of n pins in accordance with a potential supplied to the first and second pads; and
   a test circuit generating a signal changing the data bit structure in a test mode, and supplying the signal to the switching circuit.

2. The device according to claim 1, further comprising wires which connect then pins with the n pads.

3. The device according to claim 1, wherein the input capacity in each of the bit structure is approximately equally set respectively.

4. The device according to claim 3, further comprising a first and a second pads connected to the switching circuit.

5. The device according to claim 4, further comprising a bonding wire connecting at least one of the first pad and the second pad with a pin to which a fixed potential is supplied.

6. The device according to claim 3, further comprising a first fuse latch circuit and a second fuse latch circuit connected to the switching circuit, the first and the second fuse latch circuits each having a fuse and a latch for holding the state of this fuse.

7. A semiconductor memory device comprising:
   a semiconductor chip which can set a different bit structure;
   a plurality of pads on the semiconductor chip;
   a package accommodating the semiconductor chip;
   a plurality of pins being connected to the pad in accordance with e maximum bit structure of the semiconductor chip;
   a witching circuit provided inside of the semiconductor chip for switching over the data bit structure;
   a first pad and a second pad connected to the switching circuit; and
   a bonding wire for connecting at least one of the first pad and second pad and a pin to which a fixed potential is supplied;
   wherein the switching circuit outputs a set control signal for setting a bit structure in accordance with the potential supplied to the first pad and the second pod.

8. The device according to claim 7, further comprising a first fuse latch circuit and second fuse latch circuit connected to the switching circuit, the first and the second latch circuits each having a fuse and a latch holding this phase state.

9. The device according to claim 7, further comprising:
   an input circuit which receives a set control signal output from the switching circuit for controlling an input of the write data; and
   an output circuit for controlling an output of the read data by receiving the set control signal output from the switching circuit.

10. The device according to claim 7, further comprising a data mask input circuit for masking data by receiving the set control signal.

11. A semiconductor memory device comprising:
    a semiconductor chip accommodated in a package;
    n pads provided in the semiconductor chip (n is a natural number);
    m pins (m is a natural number smaller than n) provided in the package in the m pins being connected to m pads out of the n pads;
    a switching circuit for switching over a data bit structure so as input and output data via m pins out of n pins;
    a first pad anti a second pad connected to the switching circuit; and
    a bonding wire for connecting at least one of the fist pad and the second a pin to which a fixed potential is supplied;
    wherein the switching circuit outputs a set control signal for setting a bit structure in accordance with the potential which is supplied to the first pad and the second pad.

12. The device according to claim 11, further comprising bonding wires which connect the m pins with the m pads.

13. The device according to claim 11, wherein the input capacity in each of the bit structure is respectively set to approximately equal level.

14. The device according to the claim 11, further comprising a first fuse latch circuit and a second fuse latch circuit connected to the switching circuit, the circuit each having a fuse and latch for holding this fuse state.

15. The device according to claim 11, further comprising:
    an input circuit for controlling an input of the write data by receiving a set control signal output from the switching circuit; and
    an output circuit for controlling an output of a read data by receiving a set control signal output from the switching circuit.

16. The device according to claim 11, further comprising a data mask input circuit for masking data by receiving the set control signal.

* * * * *